(12) United States Patent
Kang et al.

(10) Patent No.: US 9,099,554 B2
(45) Date of Patent: Aug. 4, 2015

(54) SEMICONDUCTOR DEVICE WITH LOW ON RESISTANCE AND METHOD FOR FABRICATING THE SAME

(71) Applicant: MagnaChip Semiconductor, Ltd., Cheongju-si (KR)

(72) Inventors: SooChang Kang, Seoul (KR); YoungJae Kim, Incheon (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/080,465

(22) Filed: Nov. 14, 2013

(65) Prior Publication Data

US 2014/0252461 A1 Sep. 11, 2014

(30) Foreign Application Priority Data

Mar. 5, 2013 (KR) .......................... 10-2013-0023547

(51) Int. Cl.
| | |
|---|---|
| H01L 21/00 | (2006.01) |
| H01L 29/78 | (2006.01) |
| H01L 21/762 | (2006.01) |
| H01L 29/66 | (2006.01) |
| H01L 29/423 | (2006.01) |

(52) U.S. Cl.
CPC ...... *H01L 29/7827* (2013.01); *H01L 21/76224* (2013.01); *H01L 21/76232* (2013.01); *H01L 29/4236* (2013.01); *H01L 29/66666* (2013.01); *H01L 29/66734* (2013.01)

(58) Field of Classification Search
CPC ..................... H01L 29/66734; H01L 29/4236; H01L 21/76224; H01L 21/76232
See application file for complete search history.

(56) References Cited

U.S. PATENT DOCUMENTS

| 2008/0157194 A1* | 7/2008 | Lee et al. ................. 257/334 |
| 2010/0264486 A1* | 10/2010 | Denison et al. ............. 257/330 |
| 2012/0098057 A1* | 4/2012 | Kim et al. ................. 257/330 |
| 2013/0153992 A1* | 6/2013 | Loechelt ................... 257/330 |
| 2014/0015039 A1* | 1/2014 | Hossain .................... 257/330 |
| 2014/0252460 A1* | 9/2014 | Lee et al. ................. 257/330 |

* cited by examiner

*Primary Examiner* — Ngan Ngo
(74) *Attorney, Agent, or Firm* — NSIP Law

(57) ABSTRACT

A semiconductor device and a fabricating method thereof are provided. The semiconductor device include: a trench disposed within a substrate, the trench comprising an upper trench part that is wider than a lower trench part in width; a gate disposed in the trench; an interlayer insulating layer pattern disposed above the gate in the trench; a source region disposed within the substrate and contacting a sidewall of the upper trench part; a body region disposed below the source region in the substrate; and a contact trench disposed above the body region and filled with a conductive material.

10 Claims, 14 Drawing Sheets

SEMICONDUCTOR DEVICE WITH LOW ON RESISTANCE AND METHOD FOR FABRICATING THE SAME

CROSS-REFERENCE TO RELATED APPLICATION

This application claims the benefit under 35 U.S.C. §119(a) of Korean Patent Application No. 10-2013-0023547, filed on Mar. 5, 2013, in the Korean Intellectual Property Office, the entire disclose of which is incorporated herein by reference for all purposes.

BACKGROUND

1. Field

The following description relates to a semiconductor device, and to, for example, a semiconductor device having a trench whose upper width is wider than a lower width, and a fabricating method thereof.

2. Description of Related Art

Metal oxide semiconductor field effect transistor (MOSFET) is a type of semiconductor device that is well known in the semiconductor industry.

One type of MOSFET is a vertically-conducting trench MOSFET.

FIG. 1 is schematic diagram illustrating a sectional view of a MOSFET.

Referring to FIG. 1, a MOSFET 10 includes trenches 17. The trenches 17 each include a polysilicon gate 21 that is insulated from a body region 15 by a gate insulating layer 19.

A source region 23 contacts a side surface of each trench 17. The gate insulating layer 19 insulates the gate 21 from a metal layer 30. A semiconductor substrate 11 forms a drain of the MOSFET 10.

Still referring to FIG. 1, a reference numeral A denotes a trench width, B denotes a contact opening, and C denotes a gap between the trench and the contact opening. When the MOSFET 10 is biased in an ON state, a current vertically flows between the source region 23 and the semiconductor substrate 11. In the ON state, a current capability of the MOSFET 10 is in reverse proportion to ON resistance $Rds_{on}$ between drain and source. Hence, to improve the current capability of the MOSFET 10, the ON resistance $Rds_{on}$ has to be lowered.

One method of lowering the ON resistance of the MOSFET 10 is to increase density of the trench 17; that is, the number of trenches per unit area needs to be increased. This may be achieved by reducing a cell pitch.

However, the degree to which the cell pitch of the MOSFET may be reduced is limited by certain features of MOSFET cell and the processes used for fabricating the MOSFET.

In a MOSFET, a source region is generally formed on a semiconductor substrate in a horizontal direction from a trench to lower the ON resistance. This limits the density of the MOSFET cell per unit area.

In order to lower the ON resistance of the MOSFET, it is desirable to increase the number of trenches per unit area. However, a process of setting a gap between the trench and the contact opening on a surface of the semiconductor substrate is required in order to form the source region on the semiconductor substrate in the horizontal direction from the trench. Consequently, there is a limit to the degree to which the trench gap may be reduced, and this further limits the degree to which the ON resistance of the MOSFET may be lowered.

SUMMARY

In one general aspect, there is provided a semiconductor device including: a trench disposed within an epitaxial layer of a substrate, the trench having an upper trench part that is wider than a lower trench part in width; a gate insulating layer disposed on an inner surface of the trench; a gate disposed within the trench; an interlayer insulating layer pattern disposed on the gate insulating layer within the trench that includes the gate; a source region disposed within the substrate and contacting a sidewall of the upper trench part of the trench; a body region disposed within the epitaxial layer of the substrate; a contact trench filled with a metal, the contact trench allowing the source region and the body region to contact each other; and an impurity region disposed beneath the contact trench, the impurity region having the same type of impurity as the body region and having a higher concentration of impurity than the body region.

A lower surface of the source region may be formed lower than a lower surface of the contact trench.

An upper surface of the gate may be flush with or higher than the lower surface of the contact trench.

A depth from an upper surface of the substrate to a lower surface of the contact trench may be a half of a depth from the upper surface of the substrate to a lower surface of the lower trench part.

An upper surface of the gate may be flush with or lower than a lower surface of the contact trench.

The interlayer insulating layer pattern may include a BPSG film, HLD oxide or a combination thereof.

In another general aspect, there is provided a semiconductor device including: a trench disposed within a substrate, the trench comprising an upper trench part that is wider than a lower trench part in width; a gate disposed in the trench; an interlayer insulating layer pattern disposed above the gate in the trench; a source region disposed within the substrate and contacting a sidewall of the upper trench part; a body region disposed below the source region in the substrate; and a contact trench disposed above the body region and filled with a conductive material.

The general aspect of the semiconductor device may further include: an impurity region disposed between the contact trench and the body region, the impurity region having the same type of impurity as the body region and having a higher concentration of impurity than the body region.

A portion of the source region may be disposed above an upper surface of the gate.

In another general aspect, there is provided a method for fabricating a semiconductor device involving: forming a pad oxide layer pattern and a pad nitride layer pattern on a substrate; selectively etching the substrate using the pad nitride layer pattern as an etching mask, to form an upper trench part within the substrate; forming a nitride layer on the pad nitride layer pattern and the pad oxide layer pattern including the surface of the upper trench part; etching an entire surface of the nitride layer to form a nitride layer pattern on a sidewall of the upper trench part and sidewalls of the pad nitride layer pattern and the pad oxide layer pattern; etching the substrate beneath the upper trench part using the pad nitride layer pattern and the nitride layer pattern as an etching mask, to form a lower trench part; etching the nitride layer pattern, the pad nitride layer pattern and the pad oxide layer pattern located on the sidewall of the upper trench part, to form a trench having the lower trench part and the upper trench part, the upper trench part being wider than the lower trench part in width; forming a gate insulating layer on a surface of the trench; depositing polysilicon on the gate insulating layer within the lower trench part and the upper trench part; forming a body region within the epitaxial layer of the substrate; etching the polysilicon to form a gate within the lower trench part; forming a source region on a side surface of the upper trench part; forming an interlayer insulating layer pattern on the gate insulating layer within the upper trench part; forming a contact trench to allow the source region and the body region to contact each other; forming an impurity region beneath the contact trench, the impurity region having the same type of impurity as the body region and having a higher concentration of impurity than the body region; and filling the contact trench with a metal layer.

The contact trench may be formed using a self align contact etching method.

The interlayer insulating layer pattern may include a BPSG film, HLD oxide or a combination thereof.

The gate may be formed by etching back the polysilicon.

The general aspect of the method may further include: etching entire surfaces of the nitride layer and an oxide layer after forming the oxide layer on the surface of the upper trench part before forming the nitride layer, to form the oxide layer pattern and the nitride layer pattern on the sidewall of the upper trench part and the sidewalls of the pad oxide layer pattern and the pad nitride layer pattern.

The contact trench may be formed using a self align contact etching method.

The interlayer insulating layer pattern may include a BPSG film, HLD oxide or a combination thereof.

The gate may be formed by etching back the polysilicon.

In another general aspect, there is provided a method for fabricating a semiconductor device comprising a trench having an upper trench part and a lower trench part, the method involving: forming a first trench in a substrate by using a hard mask material layer; forming an oxide layer along an exposed surface of the first trench; forming a nitride layer along an exposed surface of the hard mask material layer; etching the oxide layer along a bottom surface of the first trench to expose the bottom surface while leaving at least a portion of the oxide layer along a side surface of the first trench; etching the substrate beneath the exposed bottom surface of the first trench to form the lower trench part of the trench; and removing the oxide layer along the side surface of the first trench to form the upper trench part of the trench, the upper trench part being wider than a lower trench part in width.

The general aspect of the method may further involve: forming a source region along a side surface of the upper trench part; forming a gate within the lower trench part; forming a interlayer insulating layer pattern within the upper trench part; forming a contact trench to contact the source region; forming an impurity region beneath the contact trench; and filling the contact trench with a conductive material.

Other features and aspects may be apparent from the following detailed description, the drawings, and the claims.

Figure 1:
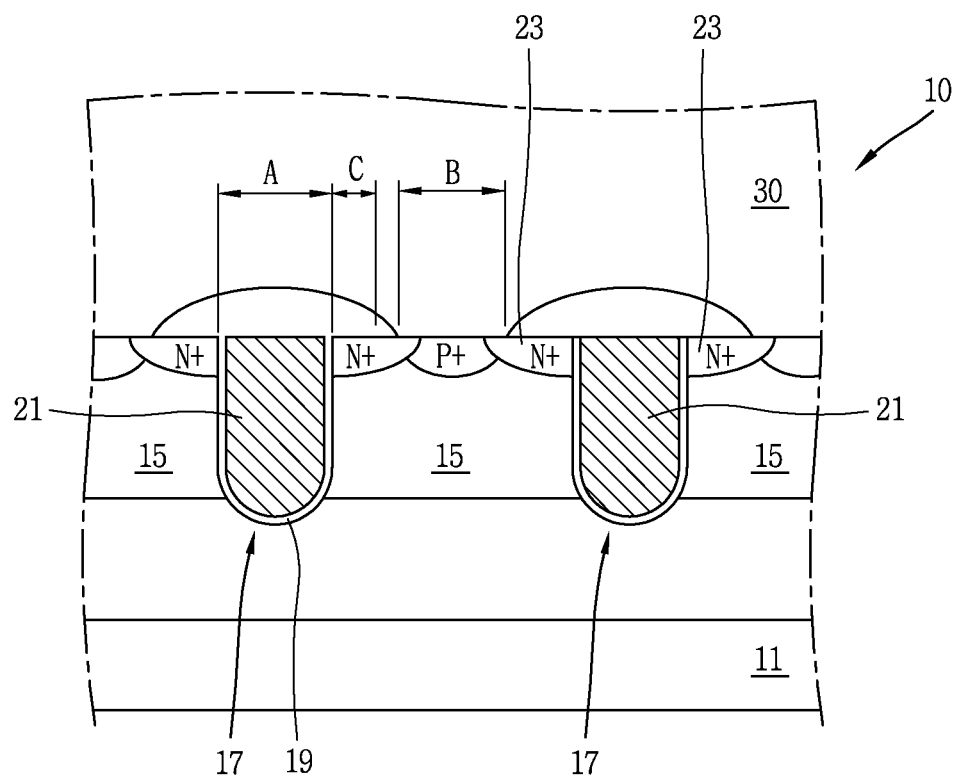
FIG. 1 is a schematic diagram illustrating a sectional view of a MOSFET that uses a trench.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 2:
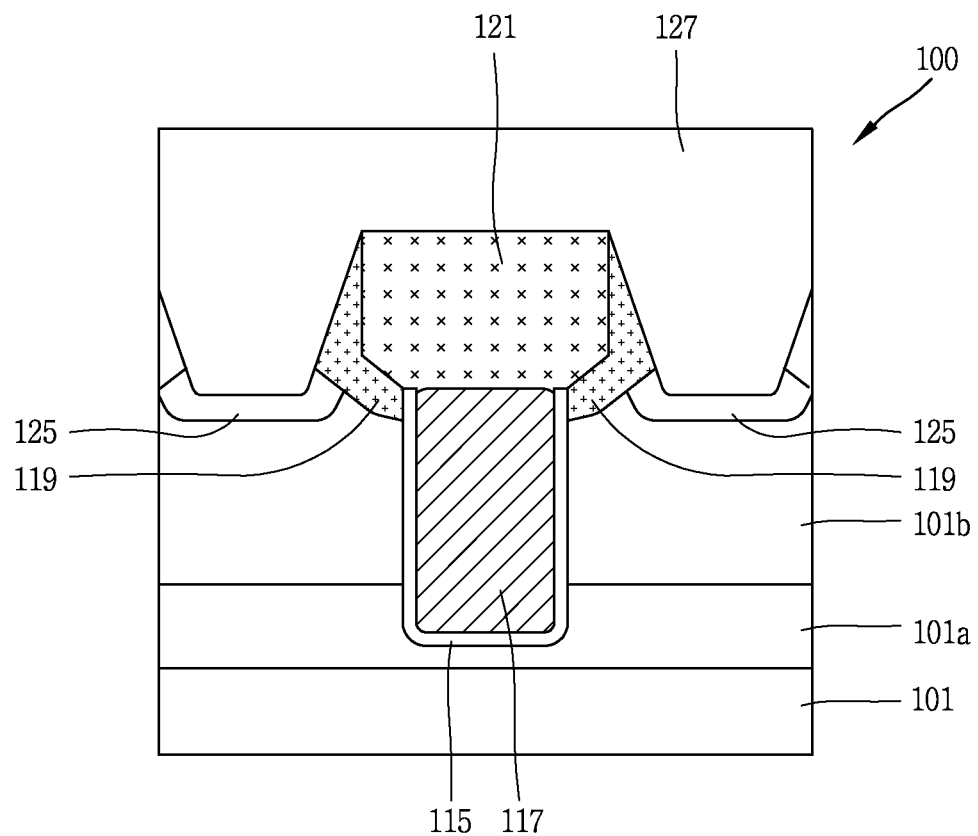
FIG. 2 is a schematic diagram illustrating a sectional view of an example of a semiconductor device according to the present disclosure.

FIG. 2 illustrates a sectional view of an example of a semiconductor device according to the present disclosure.

Referring to FIG. 2, a semiconductor device 100 may include a trench 109 (see FIG. 3H) formed within a semiconductor substrate 101 having an epitaxial layer 101a and having a lower trench part 109b and an upper trench part 109a, a width W1 of the upper trench part being wider than a width W2 of the lower trench part 109b, a gate insulating layer 115 formed on an inner surface of the trench 109, a gate 117 formed on the gate insulating layer 115 within the trench 109, a source region 119 formed within the epitaxial layer 101a of the semiconductor substrate 101 and contacting an upper sidewall of the trench 109, an interlayer insulating layer pattern 121 formed on the gate insulating layer 115 within the trench 109 including the gate 117, a body region 101b formed within the epitaxial layer 101a of the semiconductor substrate 101, a highly doped P-type region 125 formed within a surface of the body region 101b, and a metal layer 127 formed to contact the body region 101b and the source region 119 with each other.

The gate insulating layer 115 may be implemented as a silicon oxide layer, and may have a thickness of approximately 300 to 1000 Å.

The gate 117 may be made of polysilicon and formed within the lower trench part 109b. The gate 117 may be approximately 5000 to 10000 Å thick. The polysilicon may be doped with impurities.

The source region 119 may be formed within the semiconductor substrate 101, and may contact the upper trench part 109a. The source region 119 may be formed by injecting N-type impurity such as arsenic or phosphorous along a region of the semiconductor substrate that contacts the upper trench part 109a. That is, the source region 119 may be formed within the semiconductor substrate 101 corresponding to the upper trench part 109a. In this example, the semiconductor substrate 101 may be used as a drain region.

In addition, the interlayer insulating layer 121 may be made of an insulating material such as BPSG film, HLD oxide or a combination thereof, and may have a thickness of approximately 4000 to 10000 Å.

Meanwhile, the P-type body region 101b may be formed within the epitaxial layer 101a of the semiconductor substrate 101 outside the trench 105. For instance, the P-type body region 101b may be formed within an epitaxial layer of the semiconductor substrate 101 between adjacent trenches 109 by injecting P-type impurities such as boron into a surface of a contact trench.

The highly doped P-type region 125 may allow for an Ohmic contact between the metal layer 127 and the body region 101b.

As aforementioned, the semiconductor device 100 according to the present disclosure, the width W1 of the upper trench part 109a may be wider than the width W2 of the lower trench part 190b. This structural arrangement may increase the number of trenches that may be formed per unit area, thereby lowering trench resistance of the semiconductor device.

For example, with the width W1 of the upper trench part being wider than the width W2 of the lower trench part, the semiconductor device may ensure the source region 119 within the semiconductor substrate that contacts the upper trench part. This may minimize a cell pitch (a trench-trench width) so as to increase cell density. Consequently, an ON resistance value $Rds_{on}$ as one of main features of the semiconductor device using the trench can be lowered.

Hereinafter, description will be given of a method for fabricating the semiconductor device with the configuration, with reference to FIGS. 3A to 3I.

FIGS. 3A to 3I illustrate sectional views of a semiconductor device during its fabrication to sequentially illustrate an example of a method for fabricating such a semiconductor device.

Figure 3A:
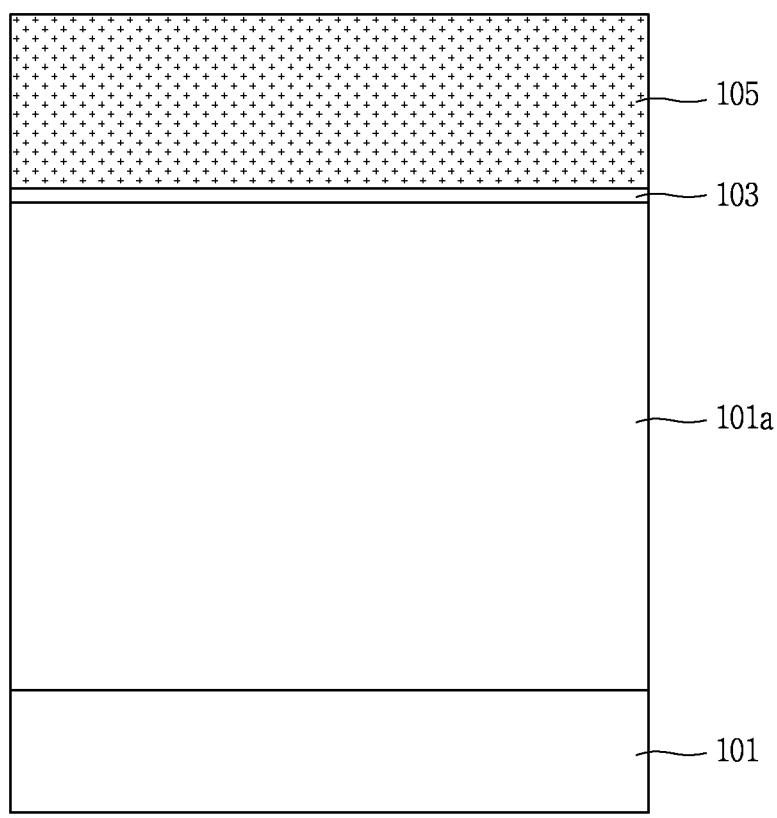
FIGS. 3A to 3K are diagrams of sectional views of an example of a semiconductor device during its fabrication for sequentially illustrating an example of a method for fabricating such a semiconductor device.

As shown in FIG. 3A, a lightly doped N-type epitaxial layer 101a may be disposed on a highly doped N-type semiconductor substrate 101. That is, a concentration of impurity in the highly doped N-type semiconductor substrate 101 may be higher than a concentration of impurity in the lightly doped N-type epitaxial layer 101a.

A pad oxide layer 103 and a pad silicon nitride layer 105 may be sequentially deposited on the semiconductor substrate 101 which is defined by an inactive layer region and an active region. In this example, the pad oxide layer 103 and the pad silicon nitride layer 105 may be used together as a hard mask material layer. Also, a thickness of the hard mask material layer may be much thinner than a depth of a deep trench. With this arrangement, a defective coating of a photosensitive layer can be reduced or prevented.

Figure 3B:
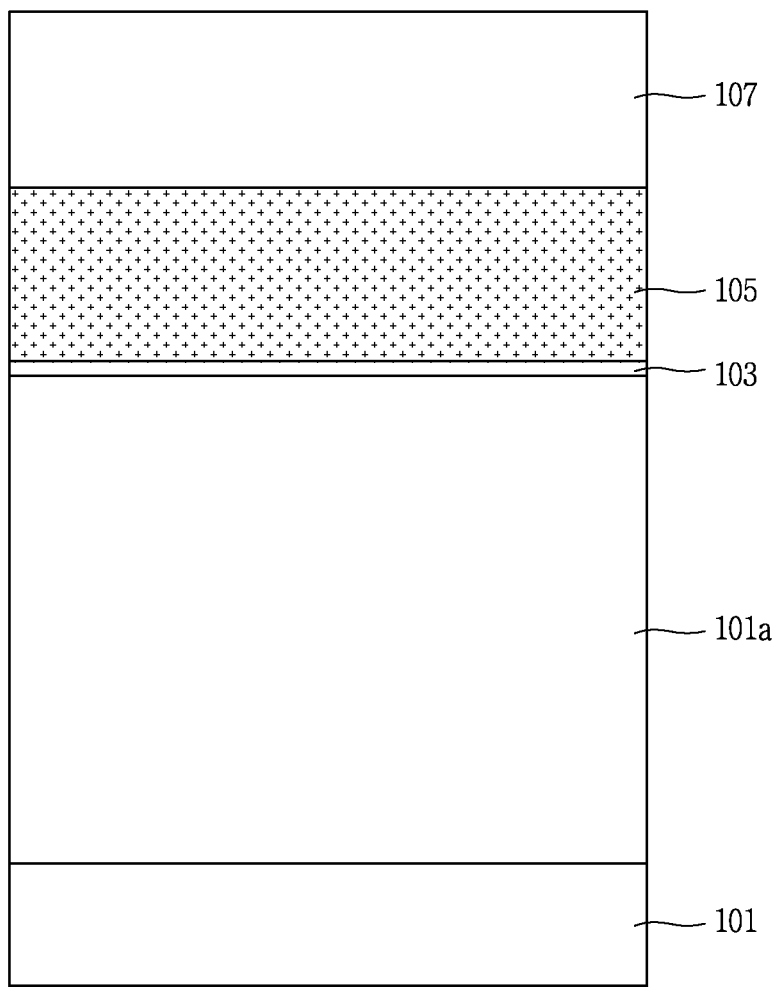

Referring to FIG. 3B, a first photosensitive layer 107 may be coated on the pad silicon nitride layer 105.

Figure 3C:
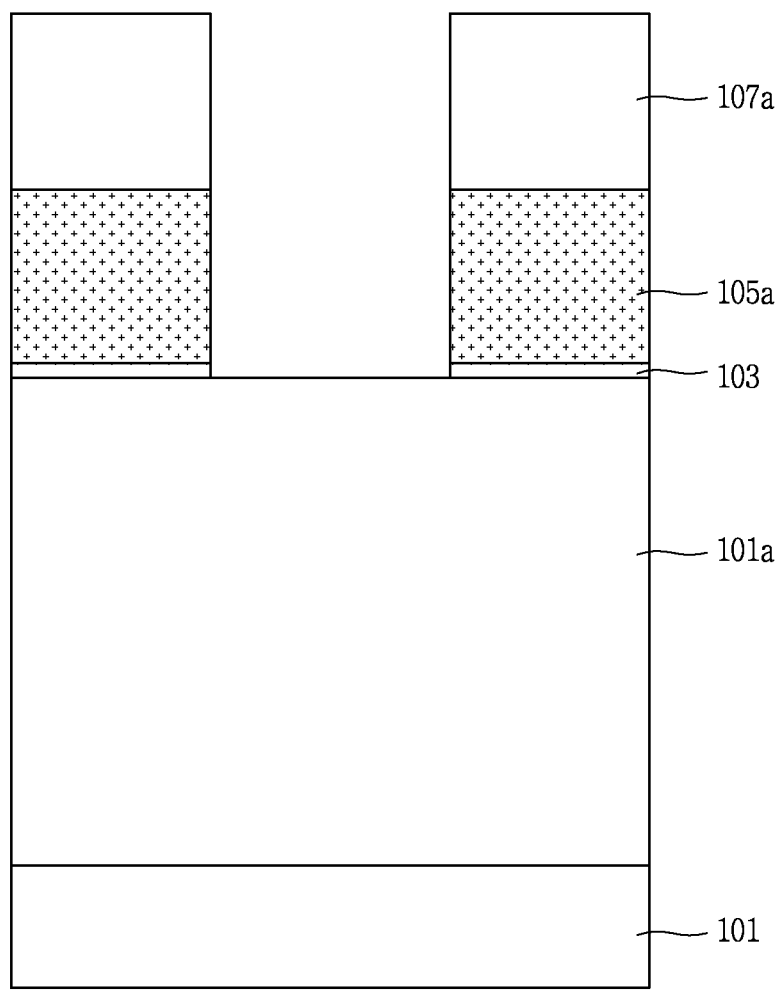

Next, referring to FIG. 3C, the photosensitive layer 107 may be exposed and developed through a photolithography process using an exposure mask (not shown), and the developed portion may be removed, thereby forming a first photosensitive layer pattern 107a.

The pad silicon nitride layer 105 and the pad oxide layer 103 which construct the hard mask may be etched using the first photosensitive layer pattern 107a as a mask, to form a pad silicon nitride pattern 105a and a pad oxide layer pattern 103a. The first photosensitive layer pattern 104 may then be removed. In this example, by performing the etching to penetrate the pad silicon nitride layer 105 and the pad oxide layer 103 that form the hard mask, it is possible to prevent or suppress the occurrence of a defective coating of the photosensitive layer, which may be caused during the etching process for forming a shallow trench, that forms an upper trench part of the trench. That is, the arrangement of layers in the hard mask may facilitate a process of defining a shallow trench forming region, which is the upper trench part forming region, through the hard mask etching process. Then, the shallow trench may be formed by using the pad silicon nitride pattern 105a that forms the hard mask.

Figure 3D:
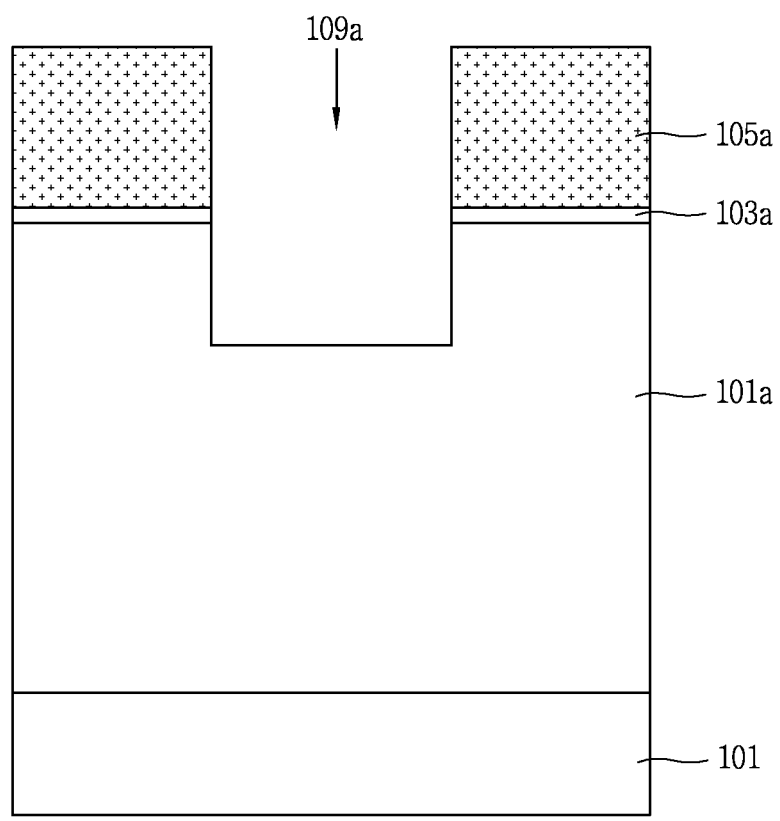

Referring to FIG. 3D, the first photosensitive layer pattern 107a may be removed. Afterwards, the pad silicon nitride layer pattern 105a and the pad oxide layer pattern 103a that construct the hard mask may be used as an etching mask to etch an exposed portion of the semiconductor substrate 101 located beneath those patterns, thereby forming an upper trench part 109a corresponding to the shallow trench.

Figure 3E:
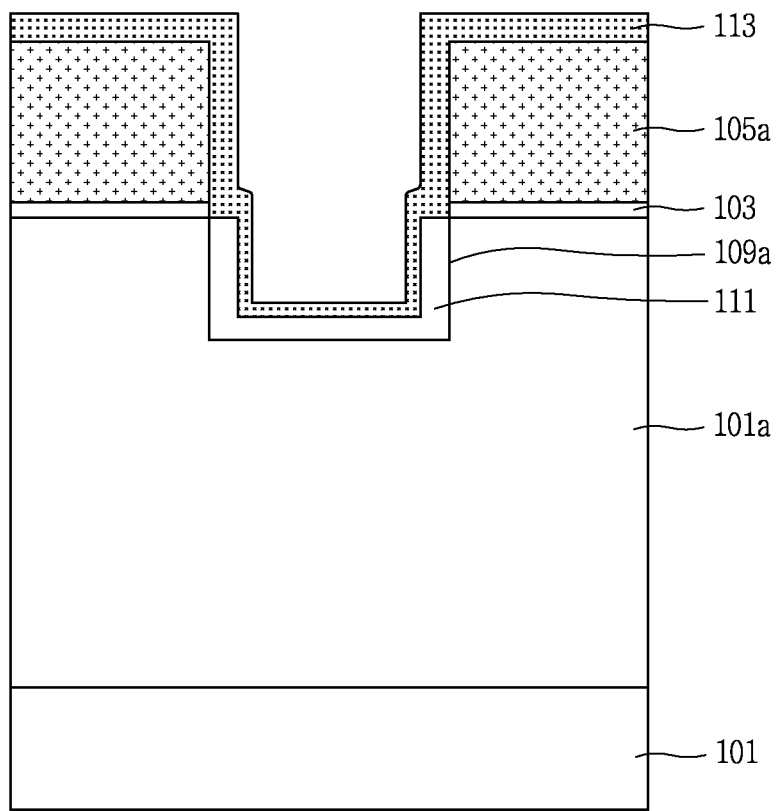

Referring to FIG. 3E, a surface of the semiconductor substrate located within the upper trench part 109a may be oxidized to form a sidewall oxide layer 111. For instance, the sidewall oxide layer 111 may be grown in a thermal oxidation manner. Also, the process of forming the sidewall oxide layer 111 may be omitted.

Afterwards, still referring to FIG. 3E, a nitride layer 113 may be deposited on an entire surface of the semiconductor substrate including the sidewall oxide layer 111 and the pad silicon nitride layer pattern 105a. In this example, even when the formation of the sidewall oxide layer 111 is omitted, the width of the upper trench part 109a may be adjusted by controlling a thickness of the nitride layer 113 formed on the entire surface of the semiconductor substrate.

Figure 3F:
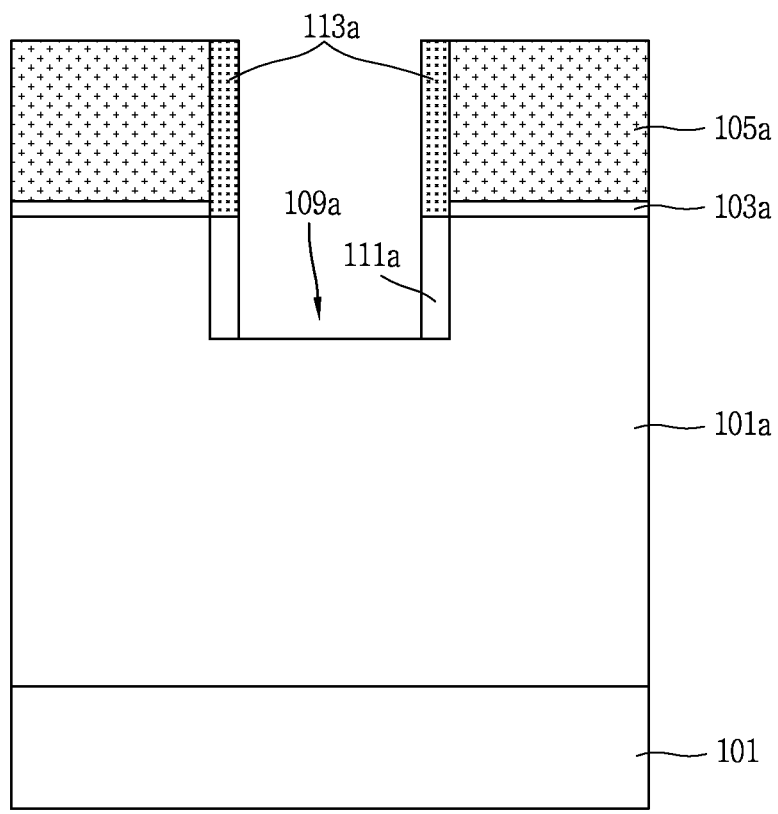

Referring to FIG. 3F, the nitride layer 113 may be etched back to form a nitride layer pattern 113a on a sidewall of the pad nitride layer pattern 105a. In this example, while etching back the nitride layer 113, the nitride layer 113 located on the sidewall oxide layer 111 and the sidewall oxide layer 111 located on the upper trench part 109a may also be removed. Consequently, the epitaxial layer 101a of the semiconductor substrate 101 beneath the upper trench part 109a may be exposed.

Figure 3G:
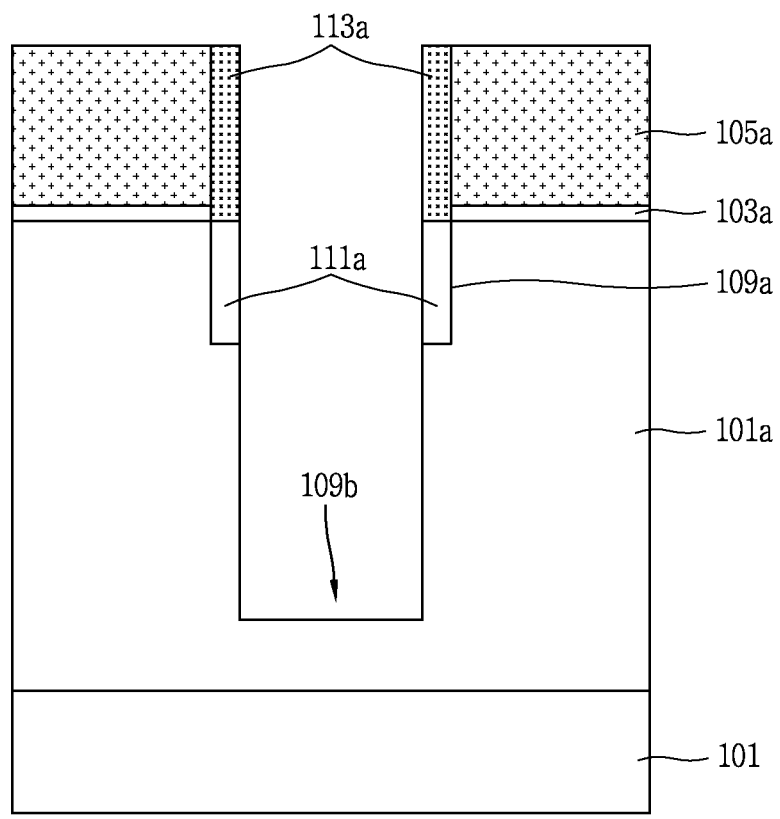

Referring to FIG. 3G, the exposed portion of the epitaxial layer 101a may be selectively etched using the pad nitride layer pattern 105a and the nitride layer pattern 113a constructing the hard mask as the etching mask, thereby forming a lower trench part 109b as a deep trench.

Figure 3H:
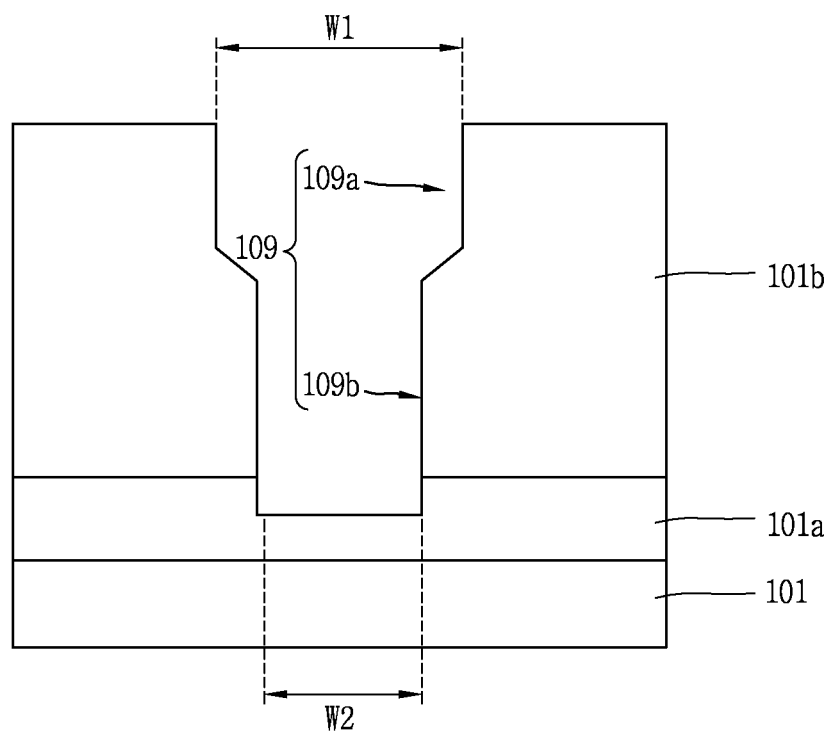

Referring to FIG. 3H, the pad nitride layer pattern 105a, the pad oxide layer pattern 103a and the sidewall oxide layer pattern 111a may be removed, forming a trench 109 having the upper trench part 109a and the lower trench part 109b. As illustrated, the width W1 of the upper trench part 109a may be wider than the width W2 of the lower trench part 109b. As the sidewall oxide layer pattern 111a located on an inner sidewall of the upper trench part 109a is removed, the inner width W2 of the lower trench part 109b may become wider by the removed sidewall oxide layer pattern 111a.

Figure 3I:
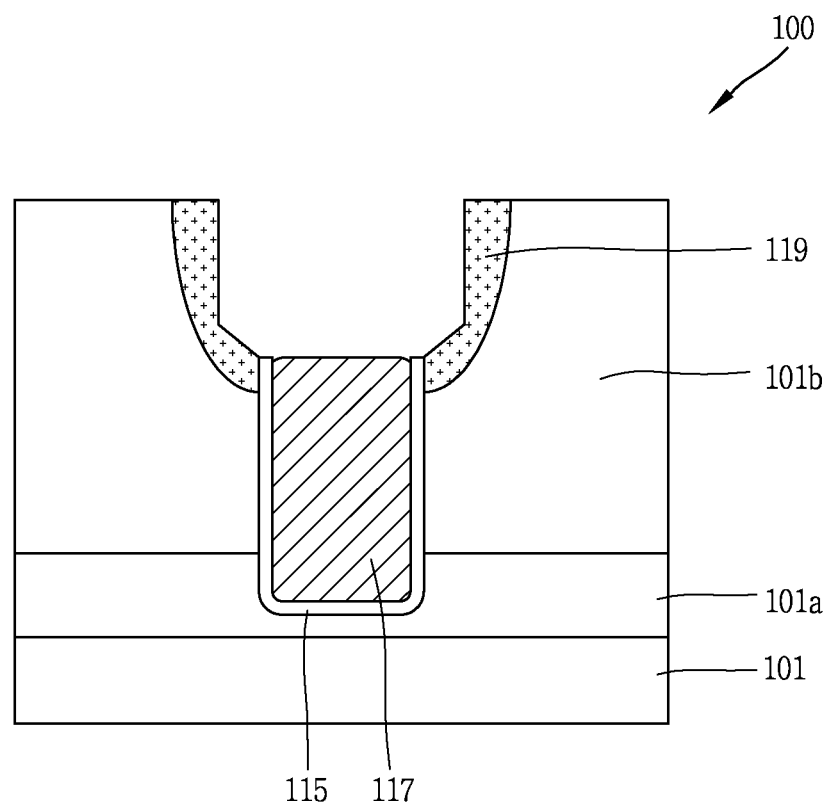

Referring to FIG. 3I, a gate insulating layer 115 may be deposited on an inner surface of the trench 109 having the upper trench part 109a and the lower trench part 109b. For instance, the gate insulating layer 115 may be implemented as a silicon oxide layer, and may have a thickness of approximately 300 to 1000 Å.

Then, a polysilicon layer (not shown) may be deposited on the gate insulating layer 115 within the trench 109 with sufficient thickness to fill up the trench 109.

The P-type body region 101b may then be formed within the epitaxial layer 101a of the semiconductor substrate 101 between adjacent trenches 109 by ion injection of P-type impurity such as boron into the epitaxial layer 101a of the semiconductor substrate 101 outside the trench 109. For instance, the P-type impurity may be ionically injected into the epitaxial layer 101a of the semiconductor substrate 101 without a separate mask.

The polysilicon layer (not shown) may then be etched back. leaving behind only the portion that fill the lower trench part 109b, thereby forming a gate 117. The polysilicon layer may be doped with impurities.

Next, N-type impurity such as arsenic or phosphorous may be injected into the surface of the epitaxial layer 101a of the semiconductor substrate 101, along a region forms an inner wall of the upper trench part 109a, thereby forming a source region 119 within the semiconductor substrate 101 along the region that contacts the upper trench part 109a. For instance, the source region 119 may be formed within the semiconductor substrate 101 corresponding to the upper trench part 109a. The semiconductor substrate 101 may be used as a drain region.

Figure 3J:
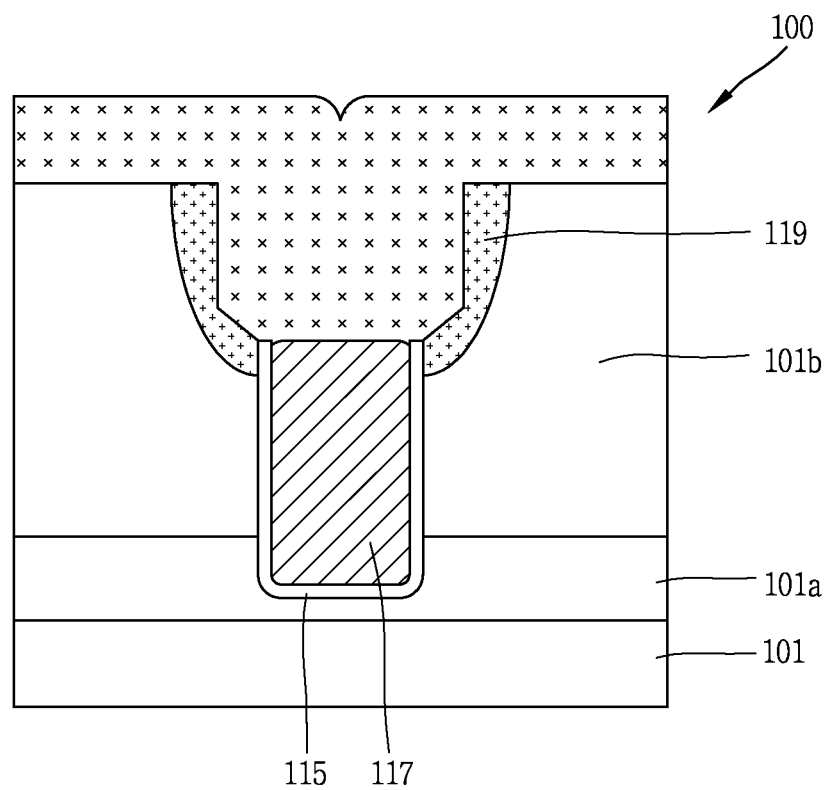

Referring to FIG. 3J, after an interlayer insulating layer is deposited on the entire surface of the semiconductor substrate 101 including the gate 117 and the gate insulating layer 115, the interlayer insulating layer may be selectively removed through planarization, thereby forming an interlayer insulating layer pattern 121 within the trench 109. Here, the interlayer insulating layer may be made of an insulating material such as BPSG film, HLD oxide or a combination thereof.

Figure 3K:
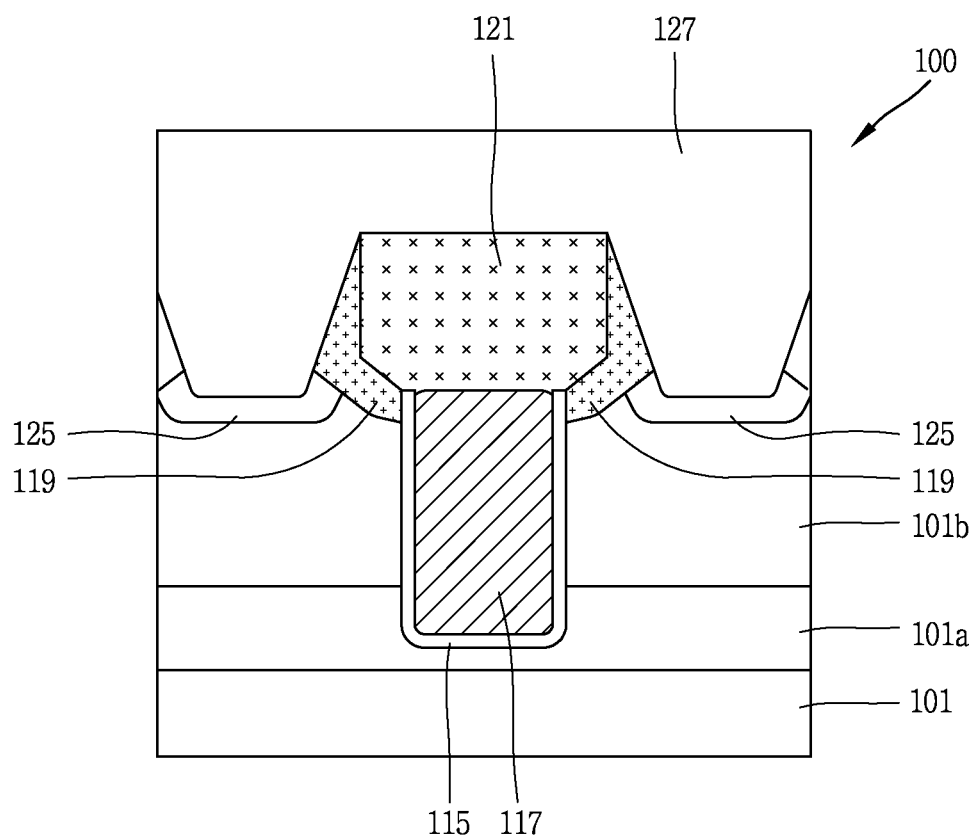

Referring to FIG. 3K, afterwards, in order to allow the body region 101b and the source region 119 of the semiconductor substrate 101 to contact each other, a contact trench may be formed using a self align contact (SAC) etching process. A highly doped P-type region 125 may then be formed through ion injection into a lower surface of the contact trench.

Next, the contact trench may be filled up with a metal to form a metal layer 127. Accordingly, the fabricating process for the semiconductor device 100 according to the present disclosure may be completed. In this example, the highly doped P-type region 125 may allow for Ohmic contact between the metal layer 127 and the body region 101b. Further, the metal layer 127 may be insulated from the gate 117 by the interlayer insulating layer pattern 121 that extends along an upper surface of each trench.

Figure 4:
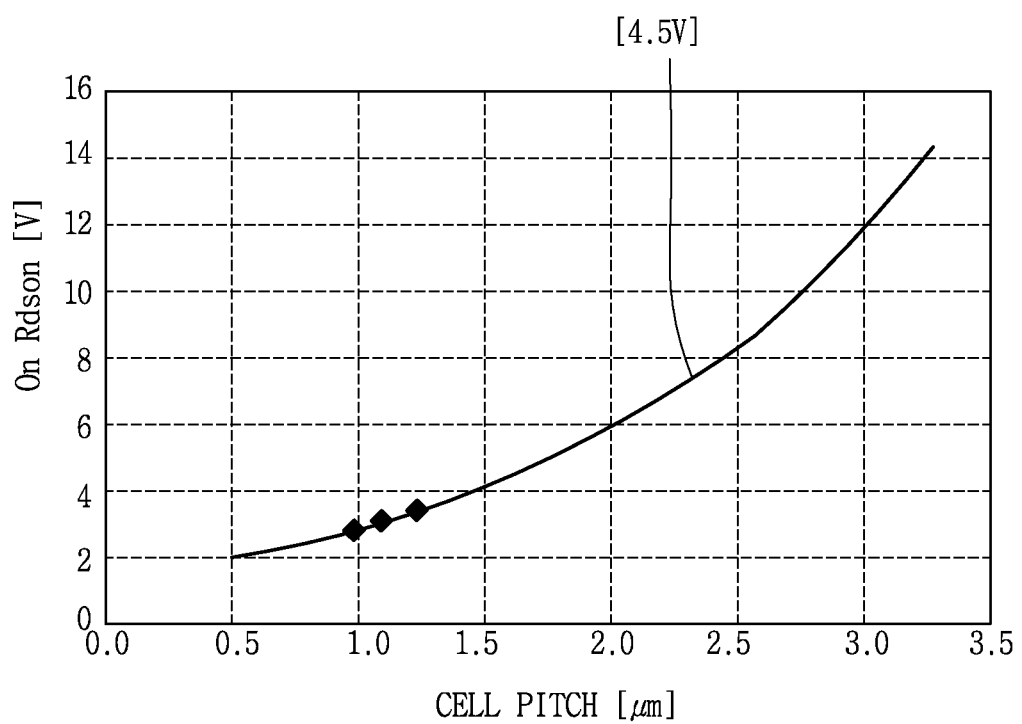
FIG. 4 is a graph showing a change in a resistance value in response to a cell pitch of an example of a semiconductor device according to the present disclosure.

FIG. 4 is a graph showing a change in a ON resistance value in response to a cell pitch of a semiconductor device according to the present disclosure.

As shown in FIG. 4, a curve graph includes a curve corresponding to a gate-source bias voltage of 4.5V.

It can be noticed that a cell pitch is reduced down to 1.0 μm in the semiconductor device according to the present disclosure.

Therefore, in the cell pitch according to the semiconductor device of the present disclosure, ON resistance $Rds_{on}$ according to the gate-source bias voltage may be reduced by approximately 20~30%.

As described above, the semiconductor device according to the present disclosure may have an upper trench part whose width is wider than a width of a lower trench part. This may increase the number of trenches formed per unit area, resulting in reduction of trench resistance of the semiconductor device.

As the semiconductor device according to the present disclosure has an upper trench part whose width is wider than a width of a lower trench part, a source region may be ensured within the semiconductor device contacting the upper trench part. This may minimize a cell pitch (a trench-trench width) and increase a cell density accordingly. Consequently, an ON resistance value as one of main features of the semiconductor device using the trench may be lowered.

Described above are various examples of semiconductor devices and methods for fabricating the same. While the examples may improve one or more drawbacks of the related art, this is not required. An aspect of the detailed description provides a semiconductor device with reduced cell pitch and lowered ON resistance, by simultaneously forming an upper trench with a wide width when forming a trench, forming an interlayer insulating layer within the upper trench with the wide width and thereafter forming a contact trench using the interlayer insulating layer as a mask, and a method for fabricating the same.

There is also provided a semiconductor device including a semiconductor substrate having an epitaxial layer, a trench formed within the epitaxial layer of the semiconductor substrate, the trench having an upper trench part wider than a lower trench part in width, a gate insulating layer formed on an inner surface of the trench, a gate formed on the gate insulating layer within the trench, an interlayer insulating layer pattern formed on the gate insulating layer within the trench including the gate, a source region formed within the semiconductor substrate contacting a sidewall of the upper trench part of the trench, a body region formed within the epitaxial layer of the semiconductor substrate, a contact trench filled up with a metal, the contact trench allowing the source region and the body region to contact each other, and a highly doped impurity region formed beneath the contact trench, the highly doped impurity region having the same type of impurity as the body region.

Further, there is provided a method for fabricating a semiconductor device. The method may involve: forming a pad oxide layer pattern and a pad nitride layer pattern on a semiconductor substrate having an epitaxial layer, selectively etching the semiconductor substrate using the pad nitride layer pattern as an etching mask, to form an upper trench part within the semiconductor substrate, forming a nitride layer on the pad nitride layer pattern and the pad oxide layer pattern including the surface of the upper trench part, etching an entire surface of the nitride layer to form a nitride layer pattern on a sidewall of the upper trench part and sidewalls of the pad nitride layer pattern and the pad oxide layer pattern, etching the semiconductor substrate beneath the upper trench part using the pad nitride layer pattern and the nitride layer pattern as an etching mask, to form a lower trench part, etching the nitride layer pattern, the pad nitride layer pattern and the pad oxide layer pattern located on the sidewall of the upper trench part, to form a trench having the lower trench part and the upper trench part, the upper trench part being wider than the lower trench part in width, forming a gate insulating layer on a surface of the trench, depositing polysilicon on the gate insulating layer within the lower trench part and the upper trench part, to fill up the trench, forming a body region within the epitaxial layer of the semiconductor substrate, etching the polysilicon to form a gate within the lower trench part, forming a source region on a side surface of the upper trench part through ion injection, forming an interlayer insulating layer pattern on the gate insulating layer within the upper trench part, forming a contact trench to allow the source region and the body region to contact each other, forming a highly doped impurity region beneath the contact trench, the highly doped impurity region having the same type of impurity as the body region, and filling up the contact trench with a metal layer.

In accordance with a semiconductor device and a fabricating method thereof of the present disclosure, since a source forming region is ensured in advance by simultaneously forming a trench part with a wide upper width upon forming a trench, a separate trench-to-contact gap may not be required. This may minimize a cell pitch and increase the number of trenches formed within the same area accordingly.

Also, in accordance with a semiconductor device and a fabricating method thereof of the present disclosure, with an upper trench part constructing a trench having a width wider than that of a lower trench part, a source region may be ensured within a semiconductor substrate contacting the upper trench part. Accordingly, a trench-to-contact gap may be reduced. This may minimize a cell pitch (trench-trench width) and increase cell density accordingly, resulting in a reduction of an ON resistance ($Rds_{on}$) value as one of main features of a semiconductor device using a trench.

It is understood that the features of the present disclosure may be embodied in different forms and should not be construed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate. Further, while the expressions such as "first" or "second" can be used to refer to various elements, the elements are not limited by the expressions. The expressions are used only for the purpose of distinguishing one element from the other. An expression in singular form encompasses plural meaning, unless otherwise specified. Throughout the description, the expression "comprise" or "have" is used only to designate the existence of characteristic, number, step, operation, element, component or a combination thereof which are described herein, but not to preclude possibility of existence of one or more of the other characteristics, numbers, steps, operations, elements, components or combinations of these or addition.

The spatially-relative expressions such as "below", "beneath", "lower", "above", "upper", etc. may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

Further, the expression such as "first conductive type" and "second conductive type" as used herein may refer to the conductive types such as N or P types which are opposed to each other, and an example explained and exemplified herein encompasses complementary examples thereof.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for fabricating a semiconductor device comprising:
   forming a pad oxide layer pattern and a pad nitride layer pattern on a substrate;
   selectively etching the substrate using the pad nitride layer pattern as an etching mask, to form an upper trench part within the substrate;
   forming a nitride layer on the pad nitride layer pattern and the pad oxide layer pattern including the surface of the upper trench part;
   etching an entire surface of the nitride layer to form a nitride layer pattern on a sidewall of the upper trench part and sidewalls of the pad nitride layer pattern and the pad oxide layer pattern;
   etching the substrate beneath the upper trench part using the pad nitride layer pattern and the nitride layer pattern as an etching mask, to form a lower trench part;
   etching the nitride layer pattern, the pad nitride layer pattern and the pad oxide layer pattern located on the sidewall of the upper trench part, to form a trench having the lower trench part and the upper trench part, the upper trench part being wider than the lower trench part in width;
   forming a gate insulating layer on a surface of the trench;
   depositing polysilicon on the gate insulating layer within the lower trench part and the upper trench part;
   forming a body region within the epitaxial layer of the substrate;
   etching the polysilicon to form a gate within the lower trench part;
   forming a source region on a side surface of the upper trench part;
   forming an interlayer insulating layer pattern on the gate insulating layer within the upper trench part;
   forming a contact trench to allow the source region and the body region to contact each other;
   forming an impurity region beneath the contact trench, the impurity region having the same type of impurity as the body region and having a higher concentration of impurity than the body region; and
   filling the contact trench with a metal layer.

2. The method of claim 1, wherein the contact trench is formed using a self align contact etching method.

3. The method of claim 1, wherein the interlayer insulating layer pattern comprises a BPSG film, HLD oxide or a combination thereof.

4. The method of claim 1, wherein the gate is formed by etching back the polysilicon.

5. The method of claim 1, further comprising:
   etching entire surfaces of the nitride layer and an oxide layer after forming the oxide layer on the surface of the upper trench part before forming the nitride layer, to form the oxide layer pattern and the nitride layer pattern on the sidewall of the upper trench part and the sidewalls of the pad oxide layer pattern and the pad nitride layer pattern.

6. The method of claim 5, wherein the contact trench is formed using a self align contact etching method.

7. The method of claim 5, wherein the interlayer insulating layer pattern comprises a BPSG film, HLD oxide or a combination thereof.

8. The method of claim 5, wherein the gate is formed by etching back the polysilicon.

9. A method for fabricating a semiconductor device comprising a trench having an upper trench part and a lower trench part, the method comprising:
   forming a first trench in a substrate by using a hard mask material layer;
   forming an oxide layer along an exposed surface of the first trench;
   forming a nitride layer on the oxide layer inside the first trench and along an exposed surface of the hard mask material layer;
   etching the oxide layer along a bottom surface of the first trench to expose the bottom surface while leaving at least a portion of the oxide layer along a side surface of the first trench;
   etching the substrate beneath the exposed bottom surface of the first trench to form the lower trench part of the trench; and
   removing the oxide layer along the side surface of the first trench to form the upper trench part of the trench, the upper trench part being wider than a lower trench part in width.

10. The method of claim 9, further comprising:
    forming a source region along a side surface of the upper trench part;

forming a gate within the lower trench part;
forming a interlayer insulating layer pattern within the upper trench part;
forming a contact trench to contact the source region;
forming an impurity region beneath the contact trench; and
filling the contact trench with a conductive material.

* * * * *